(12) United States Patent
Chu et al.

(10) Patent No.: US 7,580,192 B1
(45) Date of Patent: Aug. 25, 2009

(54) COLLIMATION LENS SYSTEM FOR LED

(75) Inventors: Man Yin Arthur Newton Chu, Hong Kong (CN); Jingdong Zhang, Hong Kong (CN); Jingbo Jiang, Hong Kong (CN); Suet To, Hong Kong (CN)

(73) Assignee: Smart Champ Enterprise Limited, Hong Kong (CN)

( * ) Notice: Subject to any disclaimer, the term of this patent is extended or adjusted under 35 U.S.C. 154(b) by 0 days.

(21) Appl. No.: 12/342,261

(22) Filed: Dec. 23, 2008

(51) Int. Cl.
G02B 27/30 (2006.01)
G02B 3/02 (2006.01)
F21S 8/10 (2006.01)

(52) U.S. Cl. .................. 359/641; 359/708; 362/317

(58) Field of Classification Search .......... 359/641, 359/708–719; 362/317–361
See application file for complete search history.

(56) References Cited

U.S. PATENT DOCUMENTS

2007/0153402 A1* 7/2007 Destain ............... 359/742

* cited by examiner

*Primary Examiner*—Scott J Sugarman
*Assistant Examiner*—Dawayne A Pinkney
(74) *Attorney, Agent, or Firm*—Leydig, Voit & Mayer, Ltd.

(57) ABSTRACT

A collimation lens system for converging the light from an LED into a light beam, includes a central lens aligned along the optical axis of the LED for converging inner light from the LED, the central lens including an aspheric collimation plano convex lens having a planar entrance surface and an aspheric exit surface; and a peripheral lens surrounding the central lens for converging outer light from the LED, the peripheral lens including a total internal reflection collimation lens having an entrance surface and an exit surface and including a high order aspheric total internal reflection surface for reflecting the outer light by total internal reflection. The central lens and the peripheral lens share a common focal point at which the LED may be positioned.

12 Claims, 4 Drawing Sheets

COLLIMATION LENS SYSTEM FOR LED

FIELD OF THE INVENTION

The present invention relates to a collimation lens system for a light-emitting diode, or LED, as a secondary optical system, and in particular but not exclusively to an LED lens designed by employing an aspherical lens surface according to the collimation principle.

BACKGROUND OF THE INVENTION

There is an increasing demand for light-emitting diodes or LEDs with a large power output and high luminous efficiency to play an important role in versatile lighting, decoration, automobile and aeronautic fields, etc., and a tendency for them to replace traditional light sources such as incandescent light bulbs. Due to limitations in photometry and colorimetry designs of the primary optical system after packing of LED chips, LED secondary optical system designs indeed determine the efficiency and effects in various applications.

As a result of the developments in high-precision processing and injection molding techniques, the light emitting efficiency as well as the beam exit angles and evenness (i.e. homochromy such as white light or red-green-blue light mixing mode) of the secondary optical lens systems produced by plastic materials with high light transmittance are significantly improved. Hence the mass production costs, especially the costs of aspheric process, are greatly reduced.

The use of flat or conical surfaces in the traditional optical designs and processes, as well as the effects of LED secondary optical lens designed by using spherical surface design processes, are known to possess shortcomings and disadvantages.

The invention seeks to mitigate or to at least alleviate one or more of such shortcomings and disadvantages by providing a new or otherwise improved collimation lens system for LED.

SUMMARY OF THE INVENTION

According to the invention, there is provided a collimation lens system for converging the light from a light-emitting diode into a light beam, comprising:
- a central lens for use in alignment along an optical axis with a said light-emitting diode for converging inner light from a said light-emitting diode, the central lens comprising an aspheric collimation plano convex lens having a planar entrance surface and an aspheric exit surface; and
- a peripheral lens surrounding the central lens for converging outer light from a said light-emitting diode, the peripheral lens comprising a total internal reflection collimation lens having an entrance surface and an exit surface and including a high order aspheric total internal reflection surface for reflecting said outer light by way of total internal reflection;
- the central lens and the peripheral lens sharing a common focal point at which a said light-emitting diode may be positioned.

Preferably, the entrance surface of the peripheral lens is substantially frusto-conical and defines a recess behind the central lens and facing a said light-emitting diode.

More preferably, the total internal reflection surface of the peripheral lens has a focal point on the optical axis, with which an imaginary apex of the entrance surface of the peripheral lens coincides.

More preferably, the entrance surface of the peripheral lens has a cone angle of 6 to 8 degrees.

Preferably, the total internal reflection surface of the peripheral lens is arranged to reflect light at an angle with the optical axis gradually varying from 7 to 30 degrees.

It is preferred that the exit surface of the peripheral lens is parabolic.

It is preferred that the exit surface of the peripheral lens is parabolic and has a focal point which coincides with the focal point of the total internal reflection surface of the peripheral lens.

It is further preferred that the exit surface of the peripheral lens has a substantially second order parabolic profile.

Preferably, the collimation lens system includes an inward step from the exit surface of the central lens to the exit surface of the peripheral lens, along a junction thereof.

Preferably, the exit surface of the central lens comprises a Fresnel surface.

Preferably, the collimation lens system has a light transmission rate higher than 90%.

In a preferred embodiment, the collimation lens system is in combination with a light-emitting diode, and the light-emitting diode is positioned within the focal length of the central lens and peripheral lens and is movable along the optical axis to change the angle of the light beam in the range from 15 to 40 degrees.

DETAILED DESCRIPTION OF PREFERRED EMBODIMENTS

Figure 1:
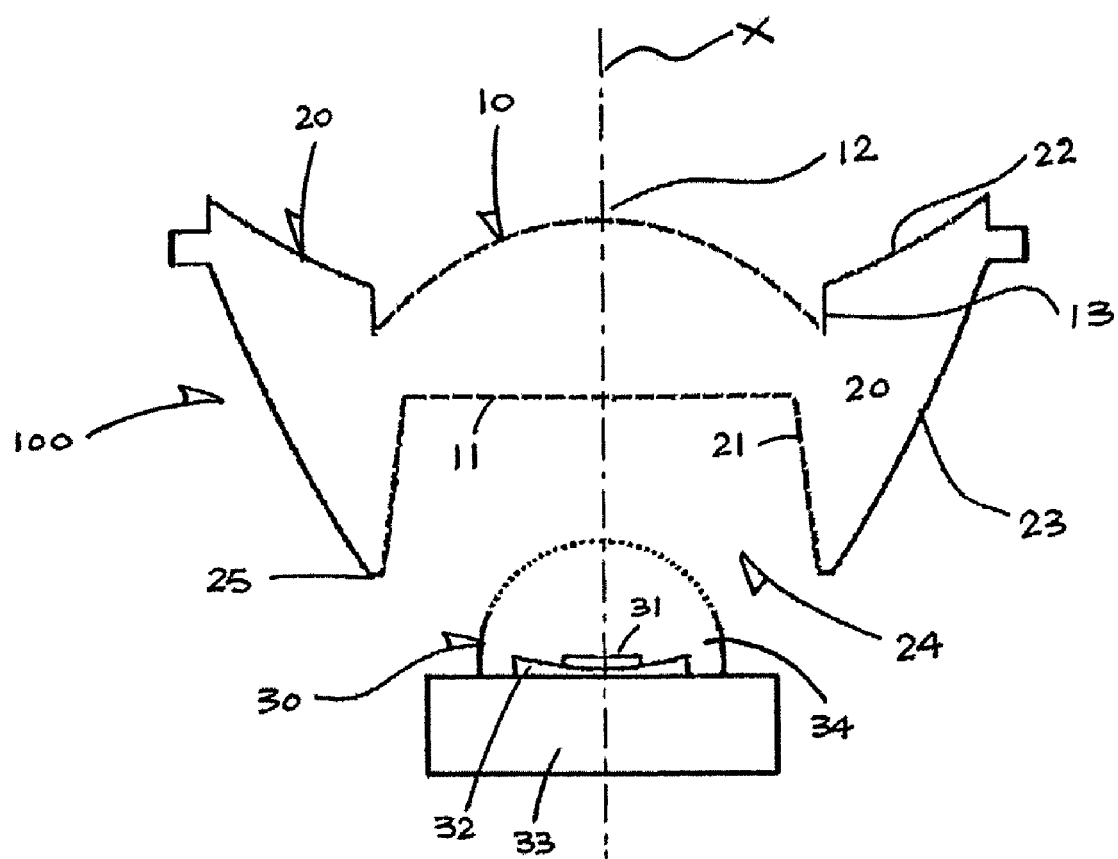
FIG. 1 is a schematic side view of a first embodiment of a collimation lens system in accordance with the invention, including a light-emitting diode.
Figure 2:
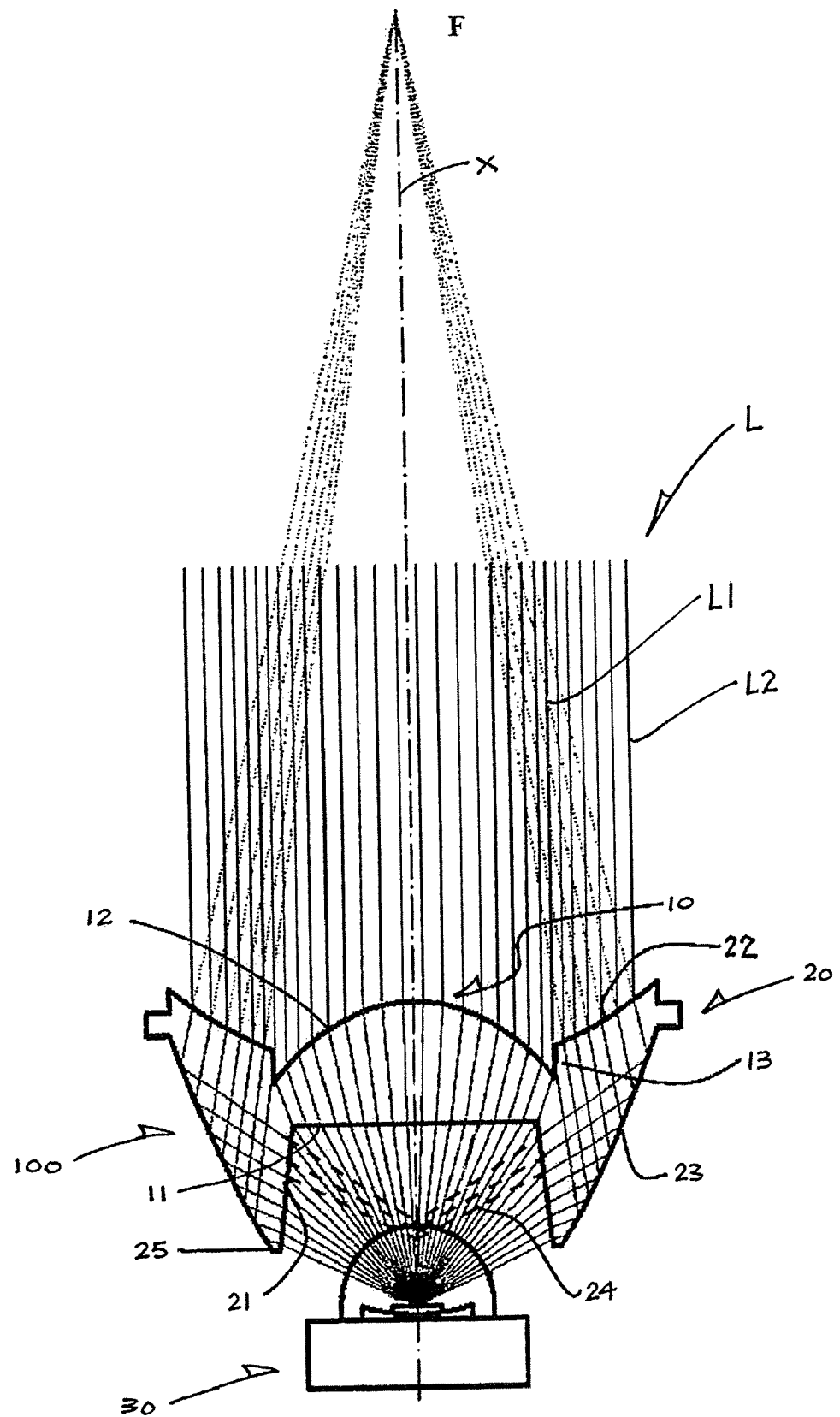
FIG. 2 is a schematic side view similar to FIG. 1, including rays illustrating how the collimation lens system converges light from the light-emitting diode into a light beam.

Referring initially to FIGS. 1 and 2 of the drawings, there is shown a first collimation lens system 100 embodying the invention for converging the light from a light-emitting diode or LED 30 into a light beam. The LED 30 is of the type provided by an LED chip 31 which is mounted on a light reflector 32 in turn fixed on an aluminum base 33 and is enclosed in a front lens structure 34 generally known as a primary optical system. LEDs of this type are capable of emitting light at a relatively high power (up to 60-120 lumens for example) over a wide-angle (e.g. 130°), usually a Lambertian illumination. They find applications in a large variety of fields, including flashlights for example as is the present case.

The collimation lens system 100, which constitutes a secondary optical system, is formed by a circular central lens 10 and an annular peripheral lens 20 surrounding the central lens 10, together in an integral structure and sharing a common central optical axis X extending vertically as shown.

The central lens 10 is an aspheric collimation plano-convex lens having a planar entrance surface 11 on its upper front side and an aspheric exit surface 12 on its lower rear side. The lens 10 is in use aligned along the optical axis X with the LED 30 for converging (inner) light emitted by the LED 30.

The peripheral lens 20 is a total internal reflection (TIR) collimation lens which has an inner entrance surface 21 and an upper exit surface 22 and includes an outer total internal reflection surface 23 extending across the entrance and exit surfaces 21 and 22. The total internal reflection surface 23 faces both the entrance and the exit surfaces 21 and 22 such that it reflects light from the entrance surface 21 through to the exit surface 22.

The entrance surface 21 of the peripheral lens 20 has a frusto-conical shape (tapering upwardly as shown) with a central axis lying along the optical axis X, and is located immediately behind (below) the planar entrance surface 11 of the central lens 10, together forming a frusto-conical recess 24 facing downwards and opening outwardly.

The exit surface 22 is concave, having a second order parabolic profile. The total internal reflection surface 23 is convex, having a high order aspheric or aspherical profile.

Aspherical surface are known, for example as referred to in optical design tools such as ZEMAX or CODE V. Most aspherical formulae are only used in the academic world for purely research purpose. High order aspherical may be defined as the coefficients in the aspherical formula for higher than $x^4$ or $x^6$ are non-zero. An aspherical surface has a more accurate design for reducing different aberration especially the spherical aberration in the lens design art.

The LED 30 is located co-axially below the recess 24 such that light emitted by the LED 30 shines directly onto the two entrance surfaces 11 and 21. More specifically, the LED 30 is positioned sufficiently close to, or slightly partially into, the recess 24 such that the central or inner portion of the LED light enters the planar entrance surface 11 right above and the side or outer portion of the LED light enters the frusto-conical entrance surface 21 around.

The inner portion of the LED light is converged by the central lens 10 into a vertical collimated light beam L1 pointing upwardly. The outer portion of the LED light is collected and converged by the peripheral lens 20, while being reflected upwardly by the lens' total internal reflection surface 23, into another vertical collimated light beam L2 which embraces the first-mentioned light beam L1. The two light beams L1 and L2 merge together as a single collimated light beam L having a substantially uniform illumination over its cross-section.

The light beam L1 alone usually has a central bright spot in its illumination area/cross-section (sometimes called a Gaussian beam) as the central lens 10 producing it is a plano-convex lens. The other light beam L2 adds light from the outer peripheral portion of the LED light to around the central light beam L1 such that the combined light beam L has a uniform illumination profile across its illumination area. The convergence use of the peripheral lens 20 improves the uniformity of the central illumination area, particularly while the beam angle increases.

The subject collimation lens system 100 is designed based on the principle of collimation. In order to operate on a single light source to produce collimated light, the central and peripheral lenses 10 and 20 are made such that they share a common focal point (i.e. having their focal points coincided) on the rear side of the lenses 10 and 20. The focal point on the rear side is where the centre of the source of light from the LED 30 is positioned—at the initial design stage.

The focal point (or focal length) of the central lens 10 is in effect dependent solely upon its surface 12 which is curved (having an aspheric profile), as the other surface 11 is planar.

As to the peripheral lens 20, its focal point F is where:
(i) an imaginary apex of the frusto-conical entrance surface 21 intersects with the central axis X
(ii) the (virtual) focal point of the total internal reflection surface 23 is
(iii) the (virtual) focal point of the exit surface 22 is In other words, the total internal reflection surface 23 and the exit surface 22 are designed to have the same focal point, with which the apex of the frusto-conical entrance surface 21 coincides.

For optimum performance, the frusto-conical entrance surface 21 is designed to have a cone angle of 6 to 8 degrees (and preferably 7 degrees), and the high order aspheric TIR surface 23 is arranged to reflect light at an angle with the optical axis X which gradually varies over the range from 7 to 30 degrees. 11. The collimation lens system 100 has a light transmission rate higher than 90%.

The exit surface 12 of the central lens 10 adjoins with the exit surface 22 of the peripheral lens 20 with an inward (downward) step 13 annularly along their junction. Stated differently, the central exit surface 12 is recessed relative to the peripheral exit surface 22 around it. The step 13 is introduced to reduce the injection thickness of the overall collimation lens system 100 by about 1-2 mm, and in turn the injection moulding volume (i.e. material) and hence the manufacturing cost.

The bottom of the peripheral lens 20 is cut with an annular planar surface 25 of about 0.5 mm wide to avoid sharp corners for the convenience of mechanical mounting.

For operation, at least one of the collimation lens system 100 and the LED 30 is manually movable relative to the other along the optical axis X, while the LED 30 stays within the focal length (on the rear side) of the central and peripheral lenses 10/20. It is usually the collimation lens system 100 that is made movable, as there is no electrical connection and it can readily be attached to the lens cap, in the case of a flashlight, for linear sliding therewith through turning of the lens cap.

In operation, the collimation lens system 100 may be slid along the axis X relative to the LED 30 in either direction in order to adjust the angle of the light beam produced by the collimation lens system 100 in the optimized range from 15 to 40 degrees. The angle of the light beam, also known as the exit angle, is gradually increased with reduction of the distance between the center of light of the LED 30 and the lenses 10/20.

If the LED 30 is arranged to move (into the recess 24 of the collimation lens system 10), the corresponding mechanical fixture structure may control the position of the LED 30 by employing the conventional linear rotation or different in-depth lock used for different angle so as to suit different purposes.

For collimating lens, the position and light distribution angle have a direct relationship or correlated, and this will compensate the adverse effect especially in the overlapping region. For conventional diverging lenses, the size and intensity of the overlapping region is more out of control in the higher order or finer subsection illumination effect.

Figure 3:
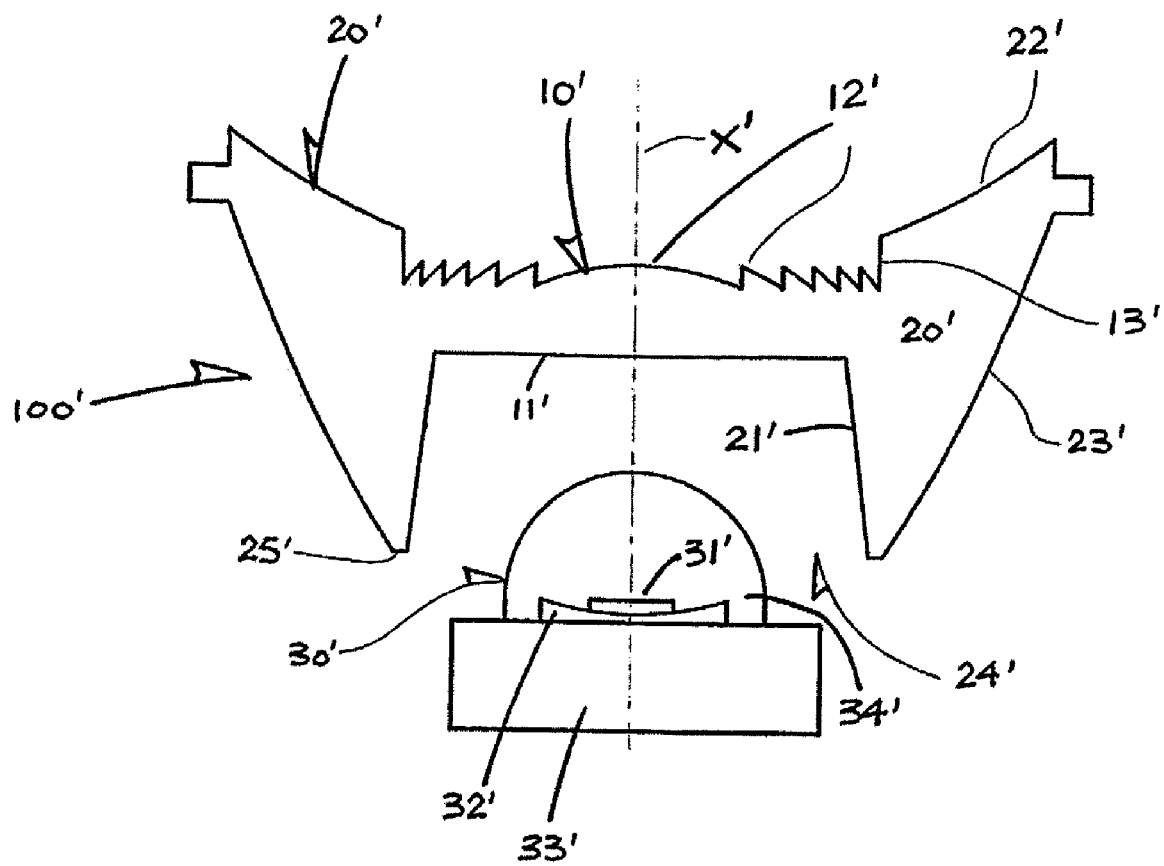
FIG. 3 is a schematic side view of a second embodiment of a collimation lens system in accordance with the invention, including a light-emitting diode.
Figure 4:
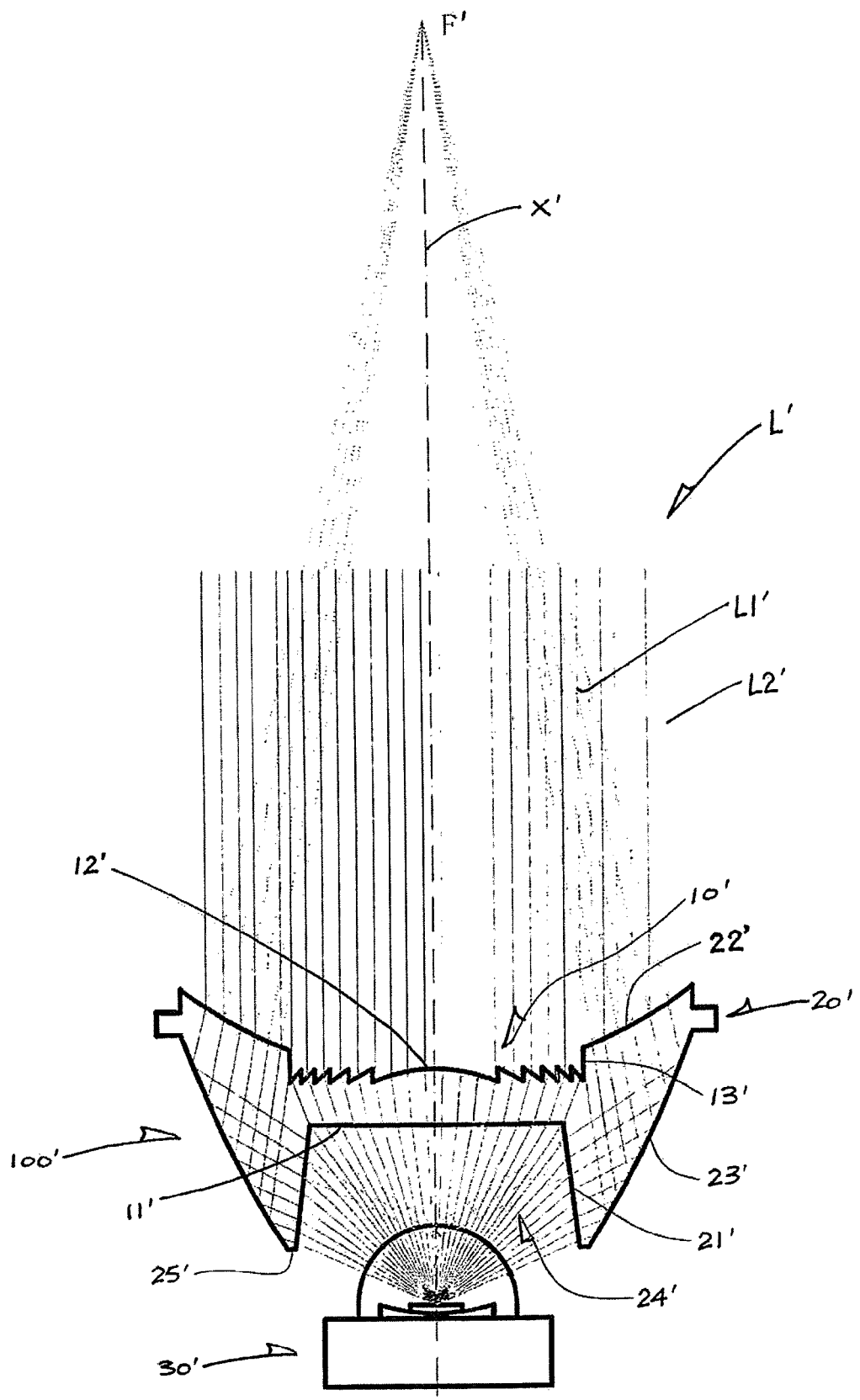
FIG. 4 is a schematic side view similar to FIG. 3, including rays illustrating how the collimation lens system converges light from the light-emitting diode into a light beam.

Reference is now made to FIGS. 3 and 4 of the drawings, which show a second collimation lens system 100' embodying the invention, which has a very similar structure and operates in the same way as the first collimation lens system 100, with equivalent parts designated by the same reference signs suffixed by an apostrophe.

The only major difference lies in the exit surface 12' of the central lens 10' being a Fresnel surface. This has an advantage to bring about further reduction in the moulding material and hence manufacturing cost, as well as improved uniformity of the illumination area.

Optical surfaces will control the light rays' directions in the geometrical space while Fresnel surfaces will further improve the light distribution in the wavelength region. The reason is that a Fresnel surface will divide the whole single continuous surface into several segments of small sub-surfaces and then put the facets into a two dimensional plane. On the border of different sub-surfaces there will be not only geometrical optics but also diffractive optics actions, which will enhance the color mixing effect and/or reduce the chromatic aberration for the optical surface.

In operation, it is possible to change the beam exit angle from 15° to 40°. The exit central light spots and edged light spots, along with the LED light source through the central aspherical surface and the edged total internal reflection, are varied in synchronous by synchronous movements of two virtual images formed by aspheric lens designed according to the homo-focus collimation principle. Compared with other conventional optical design methods, the uniformity of the angle-changeable exit beam is more efficiently controllable. Also, with special design corresponding to the mechanical fixture structure, the present invention is useful in a wide range of applications which employ a high power LED as the light source, such as high-intensity white light illumination employed in cup lamps, spot lamps, miner's lamps and the like.

The invention has been given by way of example only, and various other modifications of and/or alterations to the described embodiments may be made by persons skilled in the art without departing from the scope of the invention as specified in the appended claims.

The invention claimed is:

1. A collimation lens system for converging light output from a light-emitting diode into a light beam, comprising:
   a central lens aligned along an optical axis with a light-emitting diode for converging inner light from the light-emitting diode, the central lens comprising an aspheric collimation piano convex lens having a planar entrance surface and an aspheric exit surface; and
   a peripheral lens surrounding the central lens for converging outer light from the light-emitting diode, the peripheral lens comprising a total internal reflection collimation lens having an entrance surface and an exit surface and including a high order aspheric total internal reflection surface for reflecting the outer light by total internal reflection, wherein the central lens and the peripheral lens a common focal point at which the light-emitting diode may be positioned.

2. The collimation lens system as claimed in claim 1, wherein the entrance surface of the peripheral lens is substantially frusto-conical and defines a recess behind the central lens and facing the light-emitting diode.

3. The collimation lens system as claimed in claim 2, wherein the total internal reflection surface of the peripheral lens has a focal point on the optical axis, with which an imaginary apex of the entrance surface of the peripheral lens coincides.

4. The collimation lens system as claimed in claim 2, wherein the entrance surface of the peripheral lens has a cone angle of 6 degrees to 8 degrees.

5. The collimation lens system as claimed in claim 1, wherein the total internal reflection surface of the peripheral lens is arranged to reflect light at an angle with the optical axis gradually varying from 7 degrees to 30 degrees.

6. The collimation lens system as claimed in claim 1, wherein the exit surface of the peripheral lens is parabolic.

7. The collimation lens system as claimed in claim 3, wherein the exit surface of the peripheral lens is parabolic and has a focal point which coincides with the focal point of the total internal reflection surface of the peripheral lens.

8. The collimation lens system as claimed in claim 6, wherein the exit surface of the peripheral lens has a substantially second order parabolic profile.

9. The collimation lens system as claimed in claim 1, including an inward step from the exit surface of the central lens to the exit surface of the peripheral lens, along a junction of the central lens and the peripheral lens.

10. The collimation lens system as claimed in claim 1, wherein the exit surface of the central lens comprises a Fresnel surface.

11. The collimation lens system as claimed in claim 1, having a light transmission rate higher than 90%.

12. The collimation lens system as claimed in claim 1 in combination with a light-emitting diode, wherein the light-emitting diode is positioned within the focal lengths of the central lens and the peripheral lens and is movable along the optical axis to change the angle of the light beam in a range from 15 degrees to 40 degrees.

* * * * *